United States Patent [19]
Onoda et al.

[11] Patent Number: 5,886,402
[45] Date of Patent: Mar. 23, 1999

[54] SEMICONDUCTOR DEVICE CARD

[75] Inventors: Shigeo Onoda; Tomomi Morii, both of Tokyo, Japan

[73] Assignee: Mitsubishi Denki Kabushiki Kaisha, Tokyo, Japan

[21] Appl. No.: 899,812

[22] Filed: Jul. 24, 1997

[30] Foreign Application Priority Data

Jan. 23, 1997 [JP] Japan .................................. 9-010033

[51] Int. Cl.⁶ ................................................ H01L 23/02
[52] U.S. Cl. .......................................... 257/679; 257/678
[58] Field of Search ................................... 257/679, 678, 257/708, 723, 729, 730

[56] References Cited

U.S. PATENT DOCUMENTS

| | | | |
|---|---|---|---|
| 5,278,445 | 1/1994 | Uemura et al. | 257/679 |
| 5,493,477 | 2/1996 | Hirai | 257/679 |
| 5,502,892 | 4/1996 | Lien | 257/679 |
| 5,528,459 | 6/1996 | Ainsbury et al. | 257/679 |
| 5,548,485 | 8/1996 | Bethurum et al. | 257/679 |
| 5,563,770 | 10/1996 | Bethurum | 257/679 |
| 5,563,771 | 10/1996 | Bethurum | 257/679 |
| 5,574,628 | 11/1996 | Persia et al. | 257/679 |
| 5,578,868 | 11/1996 | Obuchi et al. | 257/679 |
| 5,590,028 | 12/1996 | Duncan | 257/679 |
| 5,600,543 | 2/1997 | Sanemitsu | 257/679 |

FOREIGN PATENT DOCUMENTS

| | | |
|---|---|---|
| 61-237458 | 10/1986 | Japan . |
| 2-111595 | 4/1990 | Japan . |
| 3-96396 | 4/1991 | Japan . |
| 3-112689 | 5/1991 | Japan . |
| 3-259364 | 11/1991 | Japan . |

Primary Examiner—Olik Chaudhuri
Assistant Examiner—Nat Kelley
Attorney, Agent, or Firm—McDermott, Will & Emery

[57] ABSTRACT

A semiconductor device card receiving a circuit substrate (1) which has electronic component parts (2) assembled therein, comprises a pair of metal sheets (10, 10) forming a front and a back surfaces of the card and a pair of opposed resin-made frames (11, 12) surrounding peripheries of the respective metal sheets to be connected by embedding bent portions 100 of the peripheries of the metal sheets (10, 10) into the resin-made frames (11, 12), and the paired opposed frames are provided at their contact end portions with fusible projections (13) and grooves (14) adapted to engage with the projections (13) and are connected to each other by fusing at least a leading end of the projection (13) within the groove (14). A plurality of projecting portions (10a) are projected downward from the bent portions (100) of one of the paired metal sheets 10 and engaging portions (10b) adapted to engage with the projecting portions (10a) are formed in the bent portions (100) of the opposite metal sheet (10), so that the paired sheet metals can be electrically conducted to each other by the engagement between the projecting portions (10a) and the engaging portions (10b) and the connection of the opposed side frames can be reinforced. The connecting strength can be improved by employing an ultrasonic bonding. While the number of the components parts can be decreased, the connecting strength can be further improved.

4 Claims, 4 Drawing Sheets

SEMICONDUCTOR DEVICE CARD

BACKGROUND OF THE INVENTION

1. Field of the Invention

The present invention relates to a semiconductor device card receiving a circuit substrate which has electronic component parts assembled thereon.

2. Description of the Related Art

Conventionally, in such a semiconductor device card, as shown in FIG. 10, various kinds of electronic component parts are assembled on a circuit substrate 1. This circuit substrate 1 is received in a card case composed of a pair of upper and lower frame members to form the semiconductor device card. Each of the frame members comprises a sheet metal 5 for forming an upper or lower card surface and a resin-made frame 6 or 7 molded to peripheries of the sheet metal 5 for forming a card side frame, and the resin-made frames 6, 7 are connected to each other by means of an adhesive agent. These sheet metals serve to shield external radio wave noises and to prevent charging of static electricity. Therefore, as shown in FIG. 11, the upper and lower sheet metals 5, 5 are electrically connected to each other by a helical spring 4 inserted into portions of the resin-made frames 6, 7 in their physically connected conditions. A connector 3 is provided at a side opening composed by a pair of said frames members for use in external electrical connection.

In this semiconductor device card, strong connection between the upper and the lower frame members is required. Therefore, there has been proposed that the sheet metals is provided at their peripheral edges with bent portions and the circuit substrate is provided at its periphery with a resin-made frame portion so that the bent portions can be embedded in the resin-made frame portion in the Japanese Unexamined Patent Publication (Tokkaihei) No. 3-96396.

There are, however, several problems associated with the above-mentioned semiconductor device card. That is, since it is necessary to force the bent portions to be embedded into the heated resin-made frame portions or to embed the bent portions in the resin-made frame portions simultaneously with the molding of the later, the circuit substrate tends to be badly affected and the assembly working would become complicated. Accordingly, the connection between the bent portion and the frame portion can't help having recourse to the adhesive agent. But, the connecting strength tends to decrease as their sizes get smaller.

On the other hand, such a semiconductor device card is required to decrease the number of component parts and the number of assembling procedures to a minimum simultaneously with the downsizing. As a trial to decrease the number of component parts, portions of the opposed sheet metals are bent so as to be brought into contact with each other to eliminate the helical spring in the Japanese Unexamined Patent Publication No. 2-111595.

SUMMARY OF THE INVENTION

Accordingly, a first object of the present invention is to improve a connecting strength by adopting an ultrasonic bonding in stead of the conventional connecting method.

A second object of the present invention is to provide such a construction as to further improve a connecting strength simultaneously with decreasing the number of component parts.

According to a first aspect of the present invention, there is provided a semiconductor device card receiving a circuit substrate provided with electronic component parts, which comprises a pair of metal sheets, each forming one of a front surface and a back surfaces of the card respectively and a pair of opposed resin-made frames surrounding said metal sheet at peripheral edges of the respective sheet metals to provide side frames, wherein said metal sheet is provided at the peripheral edges with bent portions embedded into the resin-made frames and the paired opposed side frames are provided at their contact end portions with fusible projections or sectional convex portions and grooves or sectional concaved portions adapted to receive the convex portions and are connected to each other by fusing at least leading ends of the projection within the groove.

According to a second aspect of the present invention, there is provided in a semiconductor device card receiving a circuit substrate which has electronic component parts assembled therein, a pair of sheets metals forming a front and a back surfaces of the card and a pair of opposed resin-made frames surrounding peripheral edges of the respective sheet metals are connected by embedding bent portions of the peripheral edges of the sheet metals into the resin-made frames, as well as a plurality of projecting portions are projected downward from the bent portions of one of the paired sheet metals and engaging portions adapted to engage with the projecting portions are formed in the bent portions of the opposite sheet metal, so that the paired sheet metals can be electrically conducted to each other by the engagement between the projecting portions and the engaging portions and the connection of the opposed side frames can be reinforced.

DESCRIPTION OF THE PREFERRED EMBODIMENTS

Figure 1:
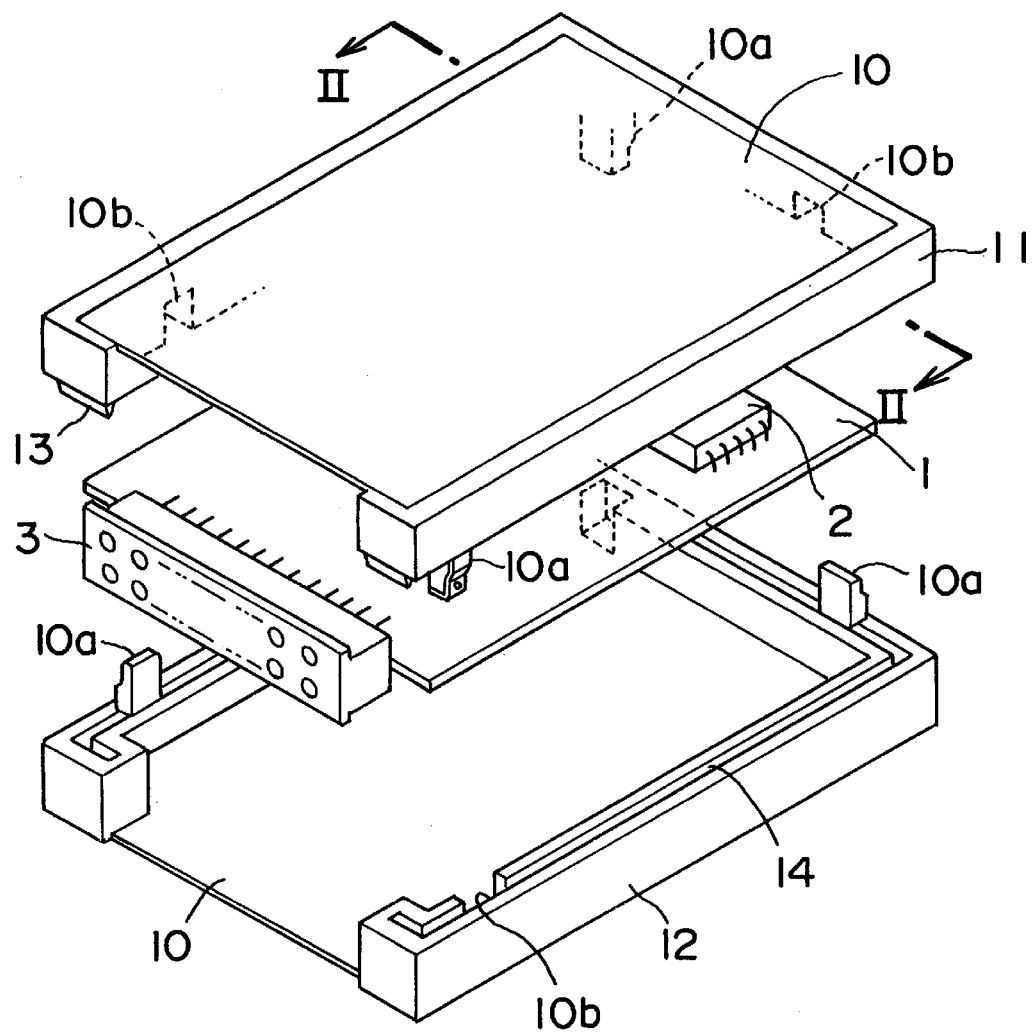
FIG. 1 is an exploded perspective view of a semiconductor device card according to the present invention.

FIG. 1 is an exploded perspective view of a semiconductor device card according to the present invention, wherein the same component parts as those of the conventional card are designated by the same symbols.

Figure 3:
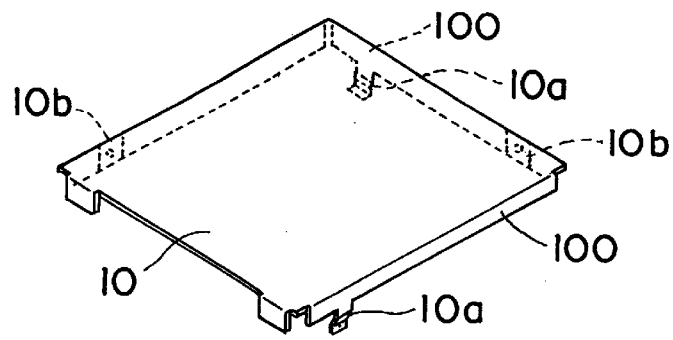
FIG. 3 is a perspective view of a sheet metal for use in the present invention.
Figure 8:
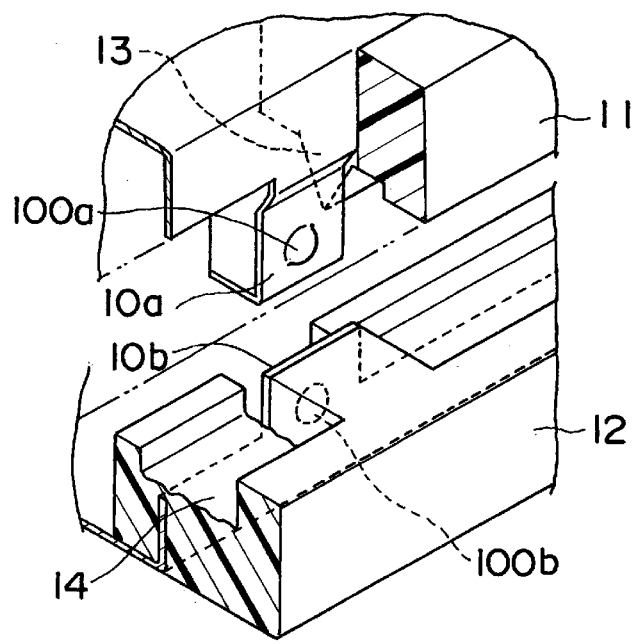
FIG. 8 is a partial perspective view showing in detail a projecting portion and an engaging portion of the sheet metal of FIG. 1.
Figure 9:
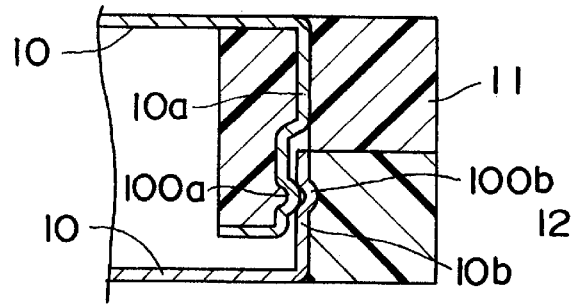
FIG. 9 is a partial sectional view showing an engaging condition in FIG. 2.
Figure 10:
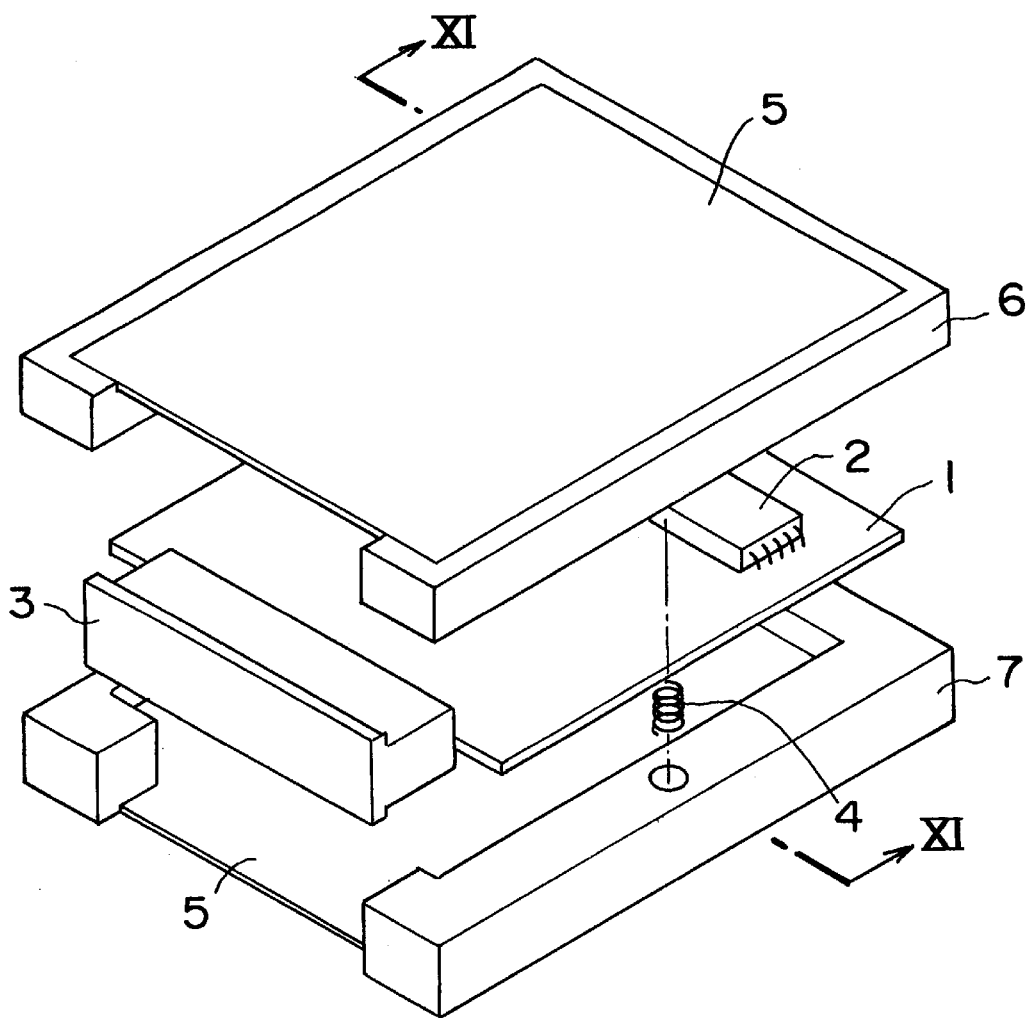
FIG. 10 is an exploded perspective view of a conventional semiconductor device card.
Figure 11:
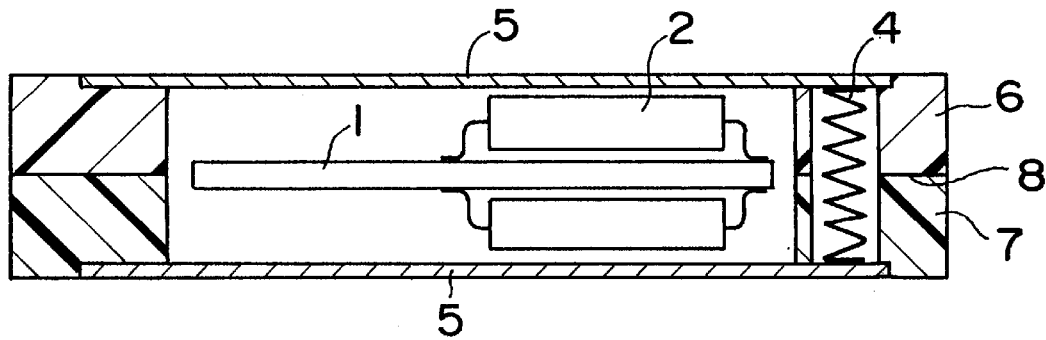
FIG. 11 is a sectional view taken along the A—A line in FIG. 10.

The symbol 10 designates a sheet metal which is used in an identical configuration and arranged symmetrically for forming a front and a back surfaces of a card. As shown in FIG. 3, this sheet metal 10 has peripheral edges bent downward at a right angle except a side for use in the inserting of a connector 3 to form bent portions 100 and further has a projecting portion 10a projected downward from one of its long side portions and an engaging portion 10b formed in the other long side portion so as to be engaged with the projecting portion of the other sheet metal as well as another projecting portion 10a projected downward from its short side portion and an engaging portion 10b formed in the short side portion so as to be engaged with the projecting portion of the other sheet metal. When explaining concretely, as shown in FIG. 8, each projecting portion 10a is projecting from one portion of the bent portion 100 and has its leading end bent as well as a lobe 100a formed in its outside. On the other hand, the engaging portion 10b has a concaved portion 100b formed in one portion of the bent portion 100 formed so as to engage with the lobe of the projecting portion. As shown in FIG. 9, the projecting portion 10a and the engaging portion 10b are engaged with each other to electrically conduct the paired upper and lower sheet metals 10, 10 and to provide a reinforcing structure for the connecting of the side frames to be described below.

Figure 2:
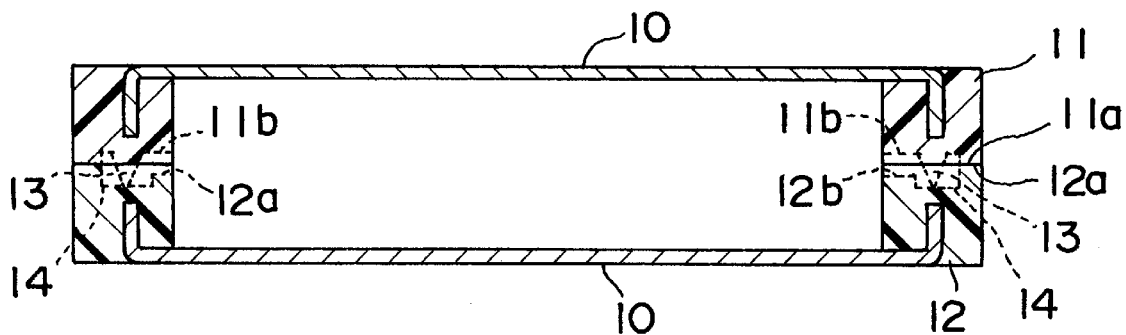
FIG. 2 is a sectional view taken along the B—B line in FIG. 1 while an inside semiconductor device is omitted.
Figure 7:
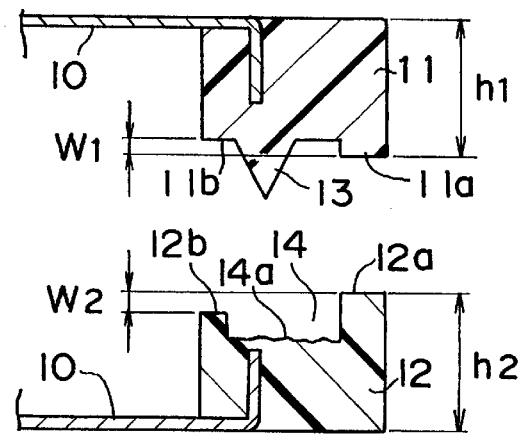
FIG. 7 is a partial sectional view showing the mode of the resin-made frame in FIG. 2.

As shown in FIGS. 1 and 2, resin-made frames 11, 12 are molded to the peripheral edge portions of the respective sheet metals 10 so that the bent portions 100 can be embedded therein except one portions thereof. When explaining in detail, as shown in FIG. 7, the upper resin-made frame 11 is provided at its contact end portion with a fusible convex portion 13 and a thickness h1 of an outside portion 11a of the side frame is made wider by W1 than a thickness of an inside portion 11b thereof. On the other hand, as shown in FIG. 7, the lower resin-made frame 12 is provided at its contact end portion with a concaved groove 14 adapted to receive the fusible convex portion 13 and a thickness h2 of an outside portion of the side frame is made wider by W2 than a thickness of an inside portion thereof. Accordingly, when the upper resin-made frame 11 and the lower resin-made frame 12 are brought into contact with each other and applied with an ultrasonic so as to be vibrated, the convex portion 13 starts to fuse and secure its leading end within the concaved groove 14. When a bottom portion inside of the concaved groove 14 is roughed, an efficiency of the ultrasonic fusing effect can be remarkably improved and also a connecting strength threat can be improved. Incidentally, since the outside portions 11a, 12a are held in contact with each other without being melted, it is possible to restrict a thickness of the card by those outside portions. Further, since an open gap is formed between the inside portions 11b, 12b under the contacted condition of the outside portions 11a, 12a (refer to FIG. 2) so that the molten resin can be prevented from flowing outside even if it overflows from the concaved groove 14, it is possible to form the card having a good outlook.

Figure 4:
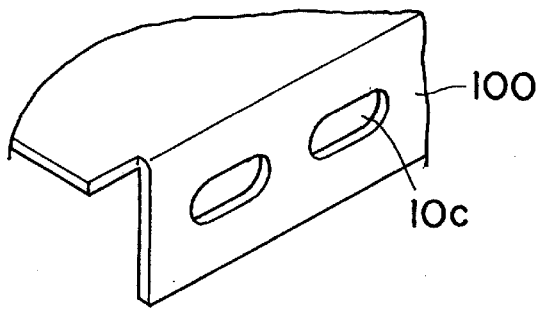
FIG. 4 is a partial perspective view showing one mode of a bent portion of the sheet metal for use in the present invention.
Figure 5:
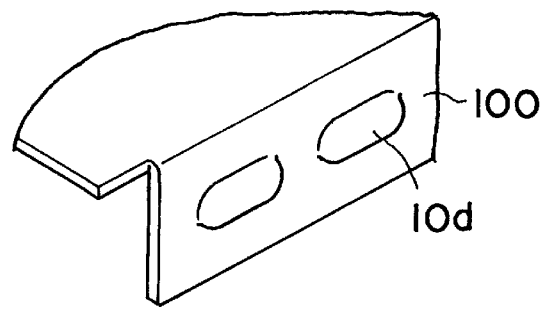
FIG. 5 is a partial perspective view showing one mode of the bent portion of the sheet metal for use in the present invention.
Figure 6:
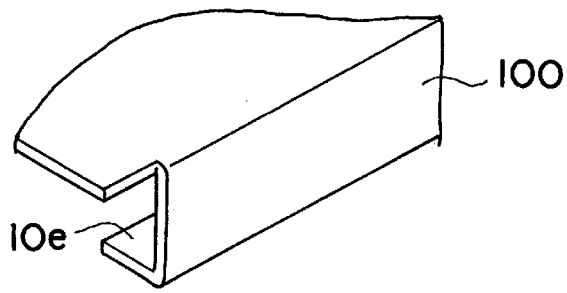
FIG. 6 is a partial perspective view showing one mode of the bent portion of the sheet metal for use in the present invention.

When a plurality of holes 10c may be formed in the bent portion 100 of the sheet metal 10 as shown in FIG. 4 and a plurality of lobes 10d may be formed therein as shown in FIG. 5, it is possible to intensify an engagement force with the resin-made frame. In addition, as shown in FIG. 6, the leading end of the bent portion 100 may be further bent.

As noted above, according to the first invention, not only the pair of sheets metals forming the front and the back surfaces of the card receiving the circuit substrate which has electronic component parts assembled therein are connected to the pair of opposed resin-made frames surrounding peripheries of the respective sheet metals by embedding bent portions of the peripheries of the sheet metals into the resin-made frames, but also the contact end portion of the side frames is provided with the fusible convex portion and the concaved groove adapted to engage with the convex portion so that at least the leading end of the convex portion can be fused and secured within the concaved portion. Therefore, since a connecting strength is larger in comparison with the conventional connection accomplished by means of the adhesive agent and a sufficient fusing strength can be secured by an extremely small area, a size of the circuit substrate to be mounted within the card can be enlarged and a mounting area for electronic component parts can be enlarged so that the card having a larger capacity can be manufactured. In addition, a time needed for assembly can be shortened and an assembly working becomes ready.

According to the second invention, since the plurality of projecting portions are projected downward from the bent portions of the pair of sheet metals which forms the front and the back surfaces of the card receiving the circuit substrate having electronic component parts assembled therein and embedded into the resin-made frames to be connected thereto and the engaging portions adapted to engage with the convex portions are formed in the bent portion of the opposite sheet metal so that the convex portions and the engaging portions can be engaged with one another, not only the pair of sheet metals can be electrically conducted to each other while the number of the components parts are decreased but also the connection of the side frames can be reinforced.

Therefore, when the construction of the first invention and the construction of the second invention are combined, the connecting strength can be improved and the number of the component parts as well as the number of the working procedures can be decreased.

What is claimed is:

1. A semiconductor device card for receiving a circuit substrate provided with electronic component parts thereon, the semiconductor device card comprising:

a pair of metal sheets, each forming one of a front surface and a back surface of the card respectively; and a pair of opposed resin-made frames surrounding said pair of metal sheets at peripheral edges of the respective metal sheets, each said metal sheets being provided with bent portions at the peripheral edges thereof, said bent portions being embedded into said resin-made frames;

said paired opposed resin-made frames being provided with opposed connecting portions configured for abutment with each other, one of said opposed connecting portions including a fusible projection extending therealong and the other connecting portion including a groove extending therealong, said groove being configured to receive the fusible projection and form a gap around the fusible projection;

wherein said opposed connecting portions are connected to each other by fusing at least leading ends of the fusible projection within the groove.

2. The semiconductor device card according to claim 1, wherein said fusible projection and groove are provided on a width center line of the connecting portions respectively with an inner zone and an outer zone from said fusible projection and groove, said inner zone being wider than said outer zone.

3. A semiconductor device card for receiving a circuit substrate provided with electronic component parts thereon, the semiconductor device card comprising:

a pair of metal sheets, each forming one of a front surface and a back surface of the card respectively; and a pair of opposed resin-made frames surrounding said pair of metal sheets at peripheral edges of the respective metal sheets, each said metal sheets being provided with bent portions at the peripheral edges thereof, said bent portions being embedded into said resin-made frames;

a plurality of projecting portions projecting downward from the bent portions of one of the paired sheet metals, each of said projecting portions including a raised portion on a surface thereof;

engaging portions formed in the bent portions of the opposite metal sheet, said engaging portions being adapted for engagement with raised portions formed on the surface of the projecting portions;

whereby the paired sheet metals can be electrically conducted to each other by the engagement between the projecting portions and the engaging portions and the connection of the opposed side frames can be reinforced.

4. The semiconductor device card according to claim 3, wherein:

said resin-made frames are provided with opposed connecting portions configured for abutment with each other;

one of said opposed connecting portions includes a fusible projection extending therealong and the other connecting portion including a groove extending therealong, said groove being configured to receive the fusible projection and form a gap around the fusible projection; and said opposed connecting portions are connected to each other by fusing at least leading ends of the fusible projection within the groove.

* * * * *